United States Patent
Chigira et al.

(10) Patent No.: US 6,507,884 B1
(45) Date of Patent: *Jan. 14, 2003

(54) MICROCOMPUTER WITH MULTIPLE MEMORIES FOR STORING DATA

(75) Inventors: Kazumasa Chigira, Kiryu (JP); Tsunehiko Yatsu, Tatebayashi (JP); Kazuo Hotaka, Hanyu (JP); Norimasa Kanahori, Ashikaga (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/218,768

(22) Filed: Dec. 22, 1998

(30) Foreign Application Priority Data

Dec. 25, 1997 (JP) .............................. 9-357468

(51) Int. Cl.$^7$ .............................................. G06F 12/00
(52) U.S. Cl. ...................... 711/5; 711/103; 365/230.03; 365/238.5; 710/66
(58) Field of Search ...................... 711/5, 103, 171–172; 710/66; 365/230.03, 230.04, 230.01, 238.5

(56) References Cited

U.S. PATENT DOCUMENTS

| | | | |
|---|---|---|---|
| 4,644,494 A | * | 2/1987 | Muller ........................ 711/152 |
| 4,660,181 A | * | 4/1987 | Saito et al. ............ 365/189.02 |
| 5,084,843 A | * | 1/1992 | Mitsuishi et al. ........... 365/218 |
| 5,311,473 A | * | 5/1994 | McClure et al. ............ 365/201 |

OTHER PUBLICATIONS

Betty Prince, High performance memories, 1996, 3–5.*

* cited by examiner

*Primary Examiner*—Do Hyun Yoo
*Assistant Examiner*—Nasser Moazzami
(74) *Attorney, Agent, or Firm*—Hogan & Hartson, LLP

(57) ABSTRACT

A selection circuit causes either a memory 6H or 6L to enter an enabled state according to address data A16 of address data A0–A16 when a mode signal M is 1. The selection circuit comprises OR gates (10, 12) which output different outputs. When the address data A16 is 0, a nonvolatile memory 6L enters an enabled state. Then, the memory 6L is addressed according to the address data A0–A15 so that, for example, 8-bit lower data is written therein. On the other hand, when the address data A16 is 1, a nonvolatile memory 6H becomes in an enabled state. Then, the memory 6H is addressed according to the address data A0–A15 so that, for example, 8-bit upper data is written therein. Also, when an external terminal (17) is grounded, and a mode signal become 0, the OR gates (10, 12) outputs signals 0, so that the memories 6H, 6L simultaneously become in an enabled state. When data is read from corresponding addresses of each memory, data of, for example, 16-bits is obtained.

20 Claims, 4 Drawing Sheets

INPUT DATA A

MICROCOMPUTER WITH MULTIPLE MEMORIES FOR STORING DATA

BACKGROUND OF THE INVENTION

1. Field of the Invention

The present invention relates to a microcomputer in which M number of memories are operated as a single memory for processing.

2. Description of the Related Art

Microcomputers commonly incorporate a mask ROM for storing an operation controlling program and a RAM for storing data. A nonvolatile memory (a flash memory) which can collectively and electrically erase stored data is also known and can now be found in some microcomputers in the place of a mask ROM and RAM. A microcomputer having a nonvolatile memory has an advantage in that the stored operation control program can be rewritten as the nonvolatile memory can electrically erase the stored data. Therefore, more microcomputers with nonvolatile memories are becoming more common.

To develop microcomputers having nonvolatile memories, programs must be accurately formulated so that the microcomputers can operate properly. Specifically, in a development period, a formulated program is written into a microcomputer, and the microcomputer is then activated based on the written program to see whether or not the microcomputer operates properly. If an error occurs to the program, the error must be corrected or a modified program must be written into the microcomputer for evaluation. Repetition of writing and evaluation of programs enables to formulate a correct program.

Referring to FIG. 1, a program is written into a microcomputer by using a system shown in the drawing. That is, program data to be written in a nonvolatile memory of a microcomputer 103 is formulated on a personal computer 101. The formulated data is transferred in a predetermined format, such as a predetermined format corresponding to an 8-bit width of the memory of a 16-bit microcomputer, so that a PROM (program ROM) writer 102 writes an operation controlling program into a flash memory incorporated into the microcomputer 103, based on the program data.

Conventionally, a personal computer 101 transfers program data in the form of an 8-bit width format to a PROM writer 102. Here, some 16-bit microcomputers may actually use two 8-bit width memories as if they were a single 16-bit width memory. The PROM writer 102 cannot write program data into such a 16-bit width memory when it is only simply connected to the microcomputer because the PROM writer 102 is originally made for an 8-bit width memory. That is, the PROM writer 102 can not readily be used for a memory with a 16-bit memory width.

SUMMARY OF THE INVENTION

The present invention has been conceived to overcome the above problems and aims to provide a microcomputer which can use two or more memories as if they were single memory. The present invention also aims to achieve writing of data into such a memory by using a PROM writer adapted to a memory of a bit number different from the bit number of the memory.

According to the present invention, there is provided a microcomputer, comprising M number of memories each having an N-bit width and identical addresses; a selection circuit for selectively placing one memory of the M number of memories to be in an enabled state based on an externally supplied control signal to thereby select the memory; and an addressing circuit for addressing the M number of memories based on an externally supplied address signal; wherein data is written into the memory which was placed in an enabled state.

Further, in the above microcomputer, the externally supplied control signal may be a most significant bit of the externally supplied address signal.

Still further, the selection circuit may selectively choose a memory according to an externally supplied designation signal showing a writing mode, and place the M number of memories in an enabled state according to a designation signal showing a normal operation mode to make the M number of memories to operate as a memory of an N×M bits.

Still further, the memory may be a nonvolatile memory capable of electrically and collectively erasing stored data.

Also, when the M number of memories are all set in an enabled state, data of a N×M-bit width can be read from the memories.

Therefore, according to the present invention, when a program is written into a microcomputer for N×M (e.g., 16) bits by using, for example, a PROM writer, data of N-bits (e.g., 8 bits) is written into each of the M (e.g., two) number of memories each having an N-bit width. This arrangement enables writing a program into a microcomputer for N×M bits by using a PROM writer for N-bits. Therefore, a general purpose PROM writer for N bits can be used to write data with into a memory of a microcomputer for larger bit numbers. Also, data of N×M bits can be read from M number of memories by collectively designating the addresses in the memories, i.e., identical addresses, where corresponding data is stored.

BRIEF DESCRIPTION OF THE DRAWINGS

The above and other objects, features, and advantages of the present invention, will become apparent from the following description of the preferred embodiment taken in conjunction with the accompanying drawings wherein.

DESCRIPTION OF THE PREFERRED EMBODIMENT

Figure 1:
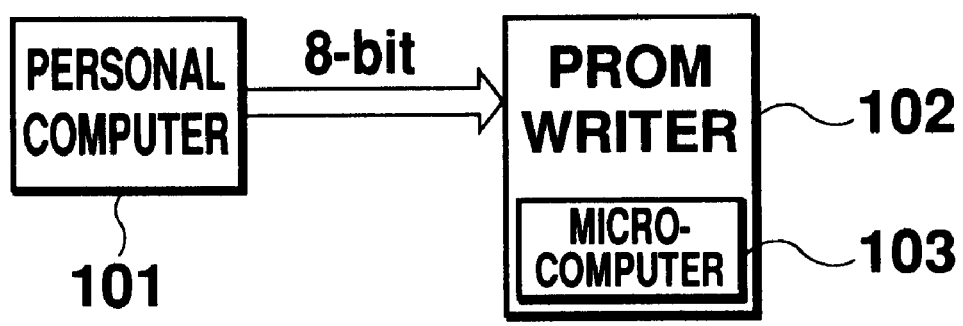
FIG. 1 is a block diagram showing a system for writing a program into a microcomputer.
Figure 2:
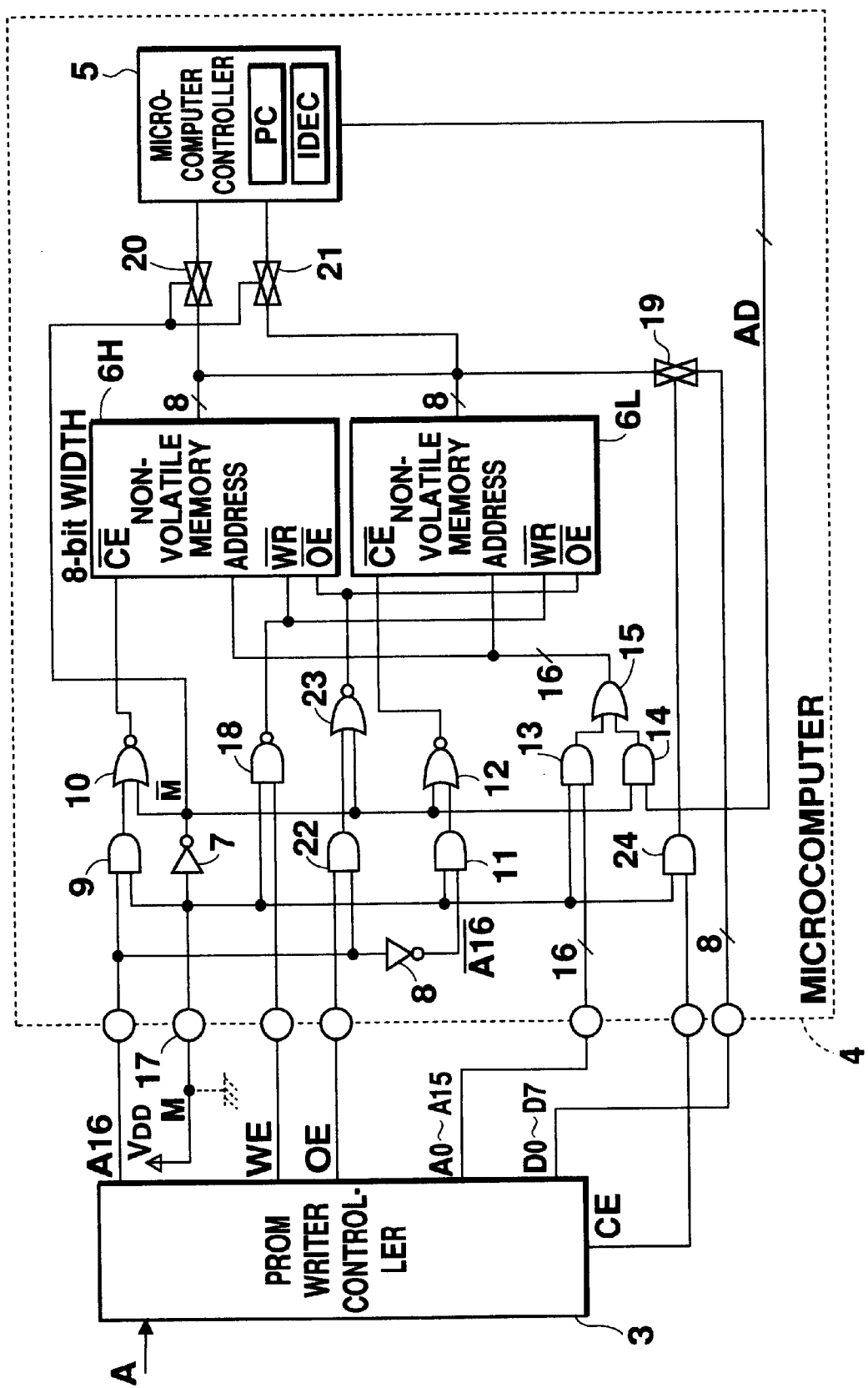
FIG. 2 is a block diagram showing the configuration of the preferred embodiment of the present invention.

Referring to FIG. 2, which shows the preferred embodiment of the present invention, a PROM writer controller 3 responds to externally supplied data A to output address data A0–A15 for designating memory addresses within a microcomputer, the most significant address data A16 for defining an enabled state of a nonvolatile memories, a mode signal M for rendering the microcomputer in a writing operation mode (all described below), a write enable signal WE, data D0–D7, a chip enable signal CE, and an output enable signal OE. A microcomputer 4 has a microcomputer controller 5 and nonvolatile memories 6H and 6L. The memories 6H and 6L each incorporate an address controller for designating an address according to address data A0–A15. The memories 6H and 6L also store upper bit data DH and lower bit data DL, respectively. An inverter 7 inverts a mode signal M into an inverted mode signal *M. An inverter 8 inverts address data A16 into inverted address data *A16. An AND gate 9 and an NOR gate 10 constitute a selection circuit for rendering the memory 6H in an enabled state by outputting the address data A16 to the memory 6H in response to a mode signal M. An AND gate 11 and a NOR gate 12 constitute a selection circuit for rendering the memory 6L in an enabled state by outputting the inverted address data *A16 to the memory 6L in response to a mode signal M. AND gates 13, 14, and OR gate 15 switch address data A0–A15 and address data AD from the microcomputer controller 5 according to a mode signal M (an inverted mode signal *M). An external terminal 17 receives a mode signal M. A NAND gate 18 passes a write enable WE signal according to a mode signal M. A transmission gate 19 passes data D0–D7. Transmission gates 20, 21 switch data lines connecting the nonvolatile memories 6H and 6L and the microcomputer controller 5 in response to an inverted mode signal *M. An AND gate 22 and a NOR gate 23 pass an output enable signal OE according to a mode signal M. An AND gate 24 is received mode signal M and chip enable signal CE and makes the transmission gate 19 on-state by own output. Note that sixteen sets of AND gates 13, 14 and OR gate 15 are provided, one set for each of the address data A0–A15, and eight sets of the transmission gates 19 to 21 are provided, one for each data item.

Figure 3:
FIG. 3 is a diagram showing data to be inputted into a PROM writer controller 3.

In the following, an operation for writing data directly from a PROM writer controller 3 to nonvolatile memories 6H and 6L when a microcomputer 4 is attached to a PROM writer, will be described referring to FIGS. 3 and 4.

Initially, data A supplied from an external personal computer (not shown) is transferred to the PROM writer controller 3 to be temporarily stored therein. Note that, in transferring data A to the PROM writer controller 3, the data A is transferred such that lower 8-bits of one 16-bit word and upper 8-bits thereof are transferred separately and in order, as shown in FIG. 3. When a writing start instruction is applied to the PROM writer controller 3, an address counter (not shown) incorporated into the PROM writer controller 3 is reset. Address data A0–A16 generated by the address counter are set zero by resetting the counter. It should be noted that a mode signal M is not directly output from the PROM writer controller 3. Mode signal M shows 1, meaning a write mode, when connected to a source voltage $V_{DD}$ shown by a solid line in FIG. 2 on a substrate (not shown) which arranges between the PROM writer controller 3 and the microcomputer 4.

The NOR gate 10 outputs a signal 1, so that the nonvolatile memory 6H, which uses an output from the NOR gate 10 as a chip enable signal, becomes in a disable state. Also, since the NOR gate 12 outputs a signal 0, the nonvolatile memory 6L, which uses an output from the NOA gate 12 as a chip enable signal, enters an enabled state.

As the inverter 7 outputs a signal *M which is 0, the transmission gates 20 and 21 enter an intercepted state, and data exchange between the microcomputer controller 5 and the nonvolatile memories 6H and 6L is prohibited. Further, in response to a mode signal M which is 1, the transmission gate 19 enters a conductive state, which allows data D0–D7 to be supplied into the nonvolatile memories 6H and 6L. Note that a mode signal M is input via the AND gate 24 to the transmission gate 19. A chip enable signal CE becomes 1 only at the time of data transmission. In response to a mode signal M, the transmission gate 19 becomes in a conductive state.

Thus, in a writing mode, the PROM writer controller 3 is allowed to write data directly into the nonvolatile memory 6L during a period when address data A16 is 0.

Figure 4:
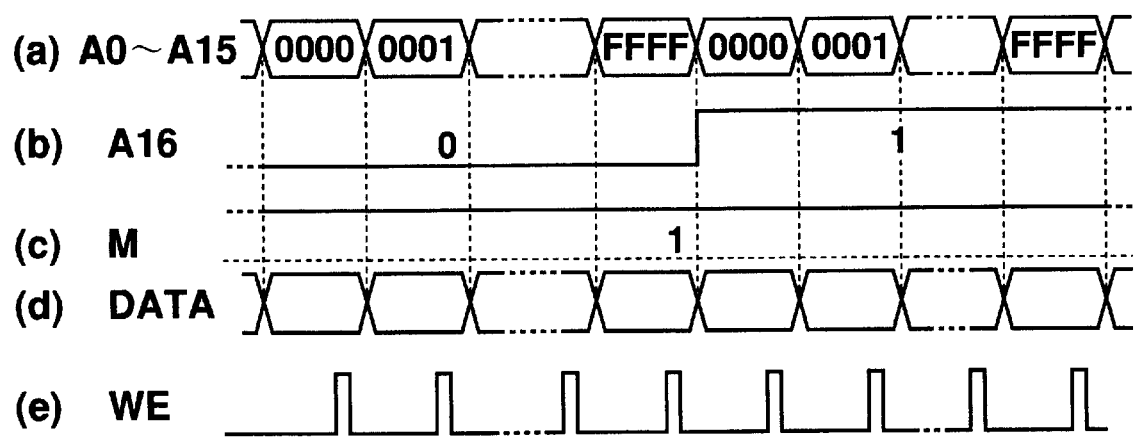
FIG. 4 is a timing chart relative to a program writing operation.

When lower bit data is applied to the PROM writer controller 3, address data A0–A15 are incremented, as shown in wave form (a) of FIG. 4, such as, for example, "0000", "0001", . . . "FFFF". The address data A0–A15 are applied to the address terminals of the nonvolatile memories 6L, 6H via the AND gate 13 and the OR gate 15. In response to an address signal, addresses in the nonvolatile memories 6H and 6L are designated.

On the other hand, in synchronism with incrementing address data, the PROM writer controller 3 outputs data D0–D7 for every 8 bits, as shown in wave form (d) of FIG. 4. Data D0–D7 are applied via the transmission gate 19 to the nonvolatile memories 6H and 6L. Then, a chip enable signal CE remains as 1. In synchronism with the output of the data D0–D7, a write enable signal WE is output, as shown in wave form (e) of FIG. 4, and applied via the NAND gate 18 to the write terminals of the nonvolatile memories 6H and 6L.

During a period when signal A16 is 0, the nonvolatile memory 6L solely remains in an enabled state. Thus, when address "0000", for example, is designated according to address signals A0–A15, address "0000" in the nonvolatile memory 6L, which is then in an writable state, is accordingly designated. Thereafter, when a write enable signal WE is applied, data D0–D7 are written into the address "0000". The above process will be repeated every time address data is incremented so that program data on the lower bit side is written into the respective addresses "0000" to "FFFF" in the nonvolatile memory 6L until the address counter of the PROM writer controller 3 counts to "FFFF".

When the address counter counts up one from "FFFF", the address data again becomes "0000", and address data A16 accordingly becomes 1. Thus, an output from the NOR gate 10 becomes 0 and that of the NOR gate 12 becomes 1, so that the nonvolatile memory 6H enters an enabled state and the nonvolatile memory 6L is disabled state. Therefore, data can be written into the nonvolatile memory 6H during a period with the address data A16 remaining as 1.

Figure 5A:
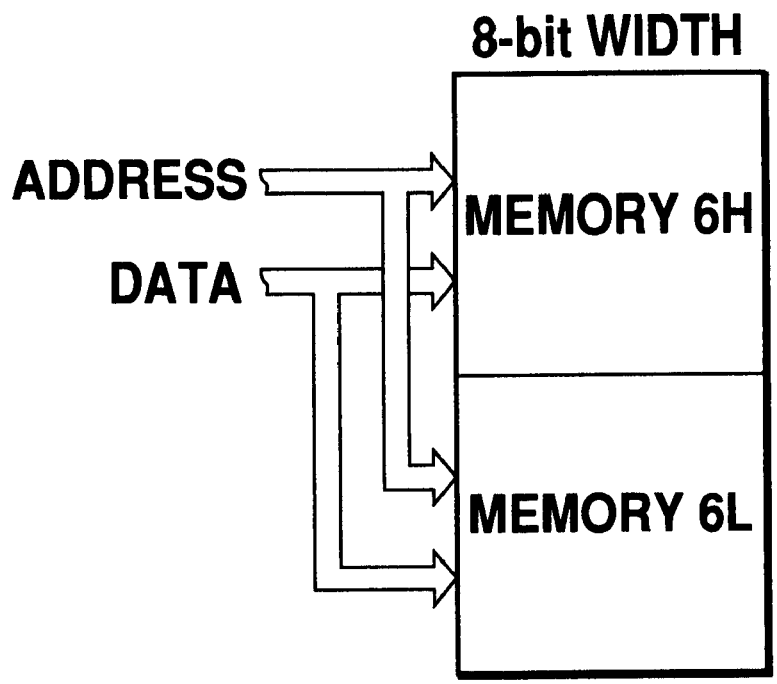
FIGS. 5A and 5B are diagrams showing memories in different formats.

During this period, similar to the above description wherein the nonvolatile memory 6L was in an enabled state, address data is sequentially incremented from "0000" to "FFFF". In synchronism with incrementing address data A0–A15 from "0000" to "FFFF", as shown in wave form (a), (d), and (e) of FIGS. 4 and, data D0–D7 of 8-bit and a write enable signal WE are generated. In this case, since the address data A16 is 1, an address in the nonvolatile memory 6H in a writable state is designated so that data is sequentially written into the nonvolatile memory 6H at designated addresses. Finally, with data written at the address "FFFF" of the nonvolatile memory 6H, program data on the upper bit side has been written into the nonvolatile memory 6H When address data becomes "FFFF", the PROM writer controller 3 completes a writing operation with program data. Therefore at the writing is complete, the nonvolatile memory 6L has been written with the program data on the lower bit side and the nonvolatile memory 6H has been written with the program data on the upper bit side. That is, data is written into each memory, as shown in FIG. 5A, so that program data of seemingly a 16-bit width is resultantly written in the combination of the two memories.

After program data is written into the nonvolatile memories 6L and 6H by the PROM writer controller 3, whether or not the data is properly written is confirmed. The confirmation is made, for example, after data was written into predetermined address in either the memory 6L or 6H or in both memories 6L, 6H. For confirmation, written data is/are read from either the memory 6L or 6H or both and compared with the data which the PROM writer controller 3 is just about to write to ascertain whether or not the data coincide.

Next, a reading operation will be described.

After writing program data into, for example, the nonvolatile memory 6L at one address, the PROM writer controller 3 controls an output enable signal OE to show 1. Since a mode signal M is 1, an output from the AND gate 22 becomes 1, while that from the NOR gate 23 becomes 0. Therefore, DE terminals of the nonvolatile memories 6H and 6L become 0. Here, since the address data A16 is 0, only the nonvolatile memory 6L becomes in a state capable of outputting written data. Thereafter, the chip enable signal CE becomes 1, and the transmission gate 19 becomes conductive, so that output data from the nonvolatile memory 6L is supplied via the transmission gate 19 into the PROM writer controller 3. Also, when the address data A16 is 1, the CE terminal of the nonvolatile memory 6H becomes 0. Thus, when an output enable signal OE is inputted, output data from the nonvolatile memory 6H is supplied to the PROM writer controller 3.

Note that the above confirmation may be made after program data is written into the nonvolatile memories 6H and 6L at all addresses.

Figure 5B:
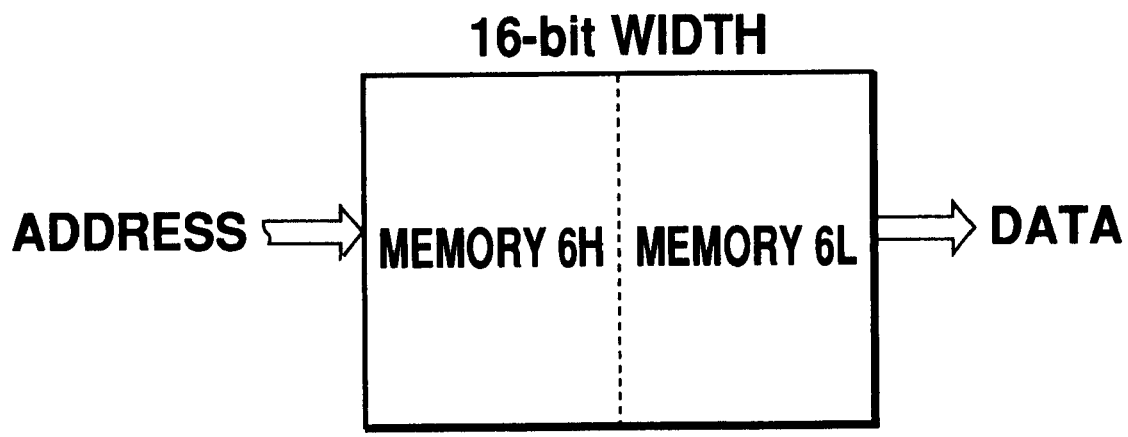

Next, an operation of using a microcomputer 4 as an microcomputer after detached from the PROM writer controller 3, will be described. The microcomputer controller 5 is activated so that the microcomputer 4 is activated according to the program written into the nonvolatile memories 6H and 6L. Initially, the external terminal 17 of the microcomputer 4 is grounded, as shown by the dotted line in FIG. 2, to thereby generate a signal M being 0. Therefore, outputs from the AND gates 9 and 11 become 0, and those from the NOR gates 10 and 12 become 0. Accordingly, the nonvolatile memories 6H and 6L become both in an enabled state, and thus ready for use as a memory of a 16-bit width, as shown in FIG. 5B.

Also, since the mode signal M is 0, an output from the AND gate 13 is 0, and the AND gate 13 enters an intercepted state. Since an output from the NAND gate 18 is always 1, writing to the nonvolatile memories 6H and 6L is prohibited. Further, the transmission gate 19 also enters an intercepted state. Since an inverted mode signal *M is 1, the AND gate 14 becomes conductive so that address data AD is inputted from the microcomputer controller 5 via the OR gate 15 to the nonvolatile memories 6H and 6L. Also, the transmission gates 20 and 21 become conductive, so that program data is input from the nonvolatile memories 6H and 6L to the microcomputer controller 5.

When the microcomputer controller 5 is activated in the above condition, a program counter PC in the microcomputer controller 5 begins counting, so that address data AD is generated according to the counter number. The generated address data AD is input via the AND gate 14 and the OR gate 15 to the nonvolatile memories 6H and 6L. According to the address data AD, the same addresses in the nonvolatile memories 6H and 6L, which are given identical addresses, are designated. Thereafter, 8-bit program data is output from each of the nonvolatile memories 6H and 6L, and input via the transmission gates 20 and 21 to the microcomputer controller 5 at substantially the same time. The 8-bit program data from the memories 6H and 6L is inputted as a program code of 16-bits into an instruction decoder IDEC.

Because the nonvolatile memories 6H and 6L are respectively stored with the upper-bit and lower-bit of the program codes, outputs from respective memories 6H and 6L together constitute decodable 16-bit program data. The 16-bit program data is decoded in the instruction decoder IDEC into an instruction, which is then executed in the microcomputer 4.

Note that although two memories each having an 8-bit width are used to constitute a memory of a 16-bit width in FIG. 2, the present invention can be applied to a microcomputer which has only number M of memories each having an N-bit width so they can be used as if they were a single memory of N×M bits. In addition, although the memory 6L is rendered to be in an enabled state for writing lower bit data prior to the memory 6H in the above example, the memory 6H may be rendered to be in an enabled state for writing upper bit data prior to the memory 6L.

What is claimed is:

1. A microcomputer comprising:

M number of memories each having an N-bit width and identical addresses for storing program data being an N×M width word in a shared manner;

a selection circuit for selectively placing one memory of the M number of memories in an enabled state based on an externally supplied control signal to thereby select the memory; and an addressing circuit for addressing the M number of memories based on an externally supplied address signal, wherein data is sequentially written into the memory which was selectively placed in an enabled state; and designation of an address of the M number of memories outputs addressed N bit datum from each of the M number of memories, each having an N-bit width, the outputted datum being combined to output a word having an M×N width.

2. The microcomputer according to claim 1, wherein the externally supplied control signal is a most significant bit of the externally supplied address signal.

3. The microcomputer according to claim 1, wherein the selection circuit selectively chooses a memory according to an externally designation signal showing a writing mode, and places the M number of memories in an enabled state according to a designation signal showing a normal operation mode to cause the M number of memories to operate as a single memory of N×M bits.

4. The microcomputer according to claim 1, wherein each of the memories is a nonvolatile memory capable of electrically and collectively erasing stored data.

5. The microcomputer according to claim 1, wherein data from a memory writer controller for N-bits can be written into the M number of memories.

6. The microcomputer according to claim 5, wherein the memory writer controller is reset at the start of writing the program data into the M number of memories.

7. The microcomputer according to claim 5, wherein the data written in the M number of memories is read and compared with data the memory writer controller writes.

8. A microcomputer comprising:

M number of memories each having an N-bit width and identical addresses for storing program data being an N×M width word in a shared manner;

a selection circuit for selectively placing one memory of the M number of memories in an enabled state based on an externally supplied control signal to thereby select the memory; and an addressing circuit for addressing the M number of memories based on an externally supplied address signal, wherein data is sequentially written into the memory which was selectively placed in an enabled state; and designation of an address of the M number of memories outputs addressed N bit datum from each of the M number of memories, each having an N-bit width, the outputted datum being combined to output a word having an M×N width.

9. The microcomputer according to claim 8, wherein the externally supplied control signal is a most significant bit of the externally supplied address signal.

10. The microcomputer according to claim 8, wherein the means for selectively placing chooses a memory according to an externally supplied designation signal showing a writing mode, and places the M number of memories in an enabled state according to a designation signal showing a normal operation mode to cause the M number of memories to operate as a single memory of N×M bits.

11. The microcomputer according to claim 8, wherein each of the memories is a nonvolatile memory capable of electrically and collectively erasing stored data.

12. The microcomputer according to claim 8, wherein data from a memory writer controller for N-bits can be written into the M number of memories.

13. The microcomputer according to claim 12, wherein the memory writer controller is reset at the start of writing the program data into the M number of memories.

14. The microcomputer according to claim 12, wherein the data written in the M number of memories is read and compared with data the memory writer controller writes.

15. A method for writing data in a microcomputer comprising the steps of:

providing M number of memories each having an N-bit width and identical addresses for storing program data being an N×M width word in a shared manner;

selectively placing one memory of the M number of memories in an enabled state based on an externally supplied control signal to thereby select the memory;

addressing the M number of memories based on an externally supplied address signal;

sequentially writing data into the memory which was selectively placed in an enabled state; and outputting addressed N bit datum from each of the M number of memories in response to designation of an address thereof, each having an N-bit width, and combining the outputted datum to output a word having an M×N width.

16. The microcomputer according to claim 15 further comprising the step of choosing a memory according to an externally supplied designation signal showing a writing mode, and placing the M number of memories in an enabled state according to a designation signal showing a normal operation mode to cause the M number of memories to operate as a single memory of N×M bits.

17. The microcomputer according to claim 15 further comprising the step of writing data from a memory writer controller for N-bits into the M number of memories.

18. The microcomputer according to claim 15 further comprising the step of writing data from a memory writer controller for N-bits into the M number of memories.

19. The microcomputer according to claim 18 further comprising the step of resetting the writer at the start of writing the program data into the M number of memories.

20. The microcomputer according to claim 18 further comprising the step of reading and comparing the data written in the M number of memories with data the memory writer controller writes.

* * * * *